(12) United States Patent
Kim et al.

(10) Patent No.: US 11,676,824 B2
(45) Date of Patent: Jun. 13, 2023

(54) CHEMICAL MECHANICAL POLISHING APPARATUS FOR CONTROLLING POLISHING UNIFORMITY

(71) Applicant: SAMSUNG ELECTRONICS CO., LTD., Suwon-si (KR)

(72) Inventors: In-kwon Kim, Hwaseong-si (KR); Seung-ho Park, Suwon-si (KR); Sang-won Bae, Suwon-si (KR); Woo-in Lee, Goyang-si (KR); Hyo-san Lee, Hwaseong-si (KR); Sun-jae Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 884 days.

(21) Appl. No.: 16/540,466

(22) Filed: Aug. 14, 2019

(65) Prior Publication Data
US 2020/0185231 A1 Jun. 11, 2020

(30) Foreign Application Priority Data
Dec. 10, 2018 (KR) .................. 10-2018-0158375

(51) Int. Cl.
*H01L 21/321* (2006.01)
*B24B 37/04* (2012.01)
(Continued)

(52) U.S. Cl.
CPC .......... *H01L 21/3212* (2013.01); *B24B 37/04* (2013.01); *B24B 37/11* (2013.01); *B24B 57/00* (2013.01)

(58) Field of Classification Search
None
See application file for complete search history.

(56) References Cited

U.S. PATENT DOCUMENTS 5,931,725 A * 8/1999 Inaba ................ H01L 21/30625
451/446
6,110,012 A * 8/2000 Maury .................... B24B 57/02
451/36
(Continued)

FOREIGN PATENT DOCUMENTS

CN 106233431 A 12/2016
EP 1038636 A2 * 9/2000 ............. B24B 37/30
(Continued)

OTHER PUBLICATIONS

Machine Generated English Translation of bib data for KR2001019987 published Mar. 15, 2001. (Year: 2001).*
(Continued)

*Primary Examiner* — Sylvia MacArthur
(74) *Attorney, Agent, or Firm* — Lee IP Law, P.C.

(57) ABSTRACT

A chemical mechanical polishing (CMP) apparatus includes a polishing pad on a polishing platen, a polishing head on the polishing pad, the polishing head having a membrane to hold a wafer on the polishing pad, and a polishing slurry feeding line to feed a polishing slurry, and a retainer ring around the membrane and in contact with the polishing pad to prevent detachment of the wafer, the retainer ring including a polishing slurry feeding inlet connected to the polishing slurry feeding line to feed the polishing slurry onto the polishing pad.

19 Claims, 20 Drawing Sheets

(51) Int. Cl.
  *B24B 57/00*  (2006.01)
  *B24B 37/11*  (2012.01)

(56) References Cited

U.S. PATENT DOCUMENTS

| | | | | |
|---|---|---|---|---|
| 6,224,472 | B1* | 5/2001 | Lai | B24B 37/32 |
| | | | | 451/288 |
| 6,225,224 | B1* | 5/2001 | Pandey | B24B 57/02 |
| | | | | 438/692 |
| 6,245,193 | B1 | 6/2001 | Quek et al. | |
| 6,336,846 | B1* | 1/2002 | Park | B24B 37/32 |
| | | | | 451/41 |
| 6,398,906 | B1* | 6/2002 | Kobayashi | B24B 41/061 |
| | | | | 156/345.12 |
| 6,419,567 | B1* | 7/2002 | Glashauser | B24B 57/02 |
| | | | | 451/259 |
| 6,447,380 | B1* | 9/2002 | Pham | B24B 37/32 |
| | | | | 451/288 |
| 6,719,874 | B1 | 4/2004 | Gotkis et al. | |
| 6,776,695 | B2 | 8/2004 | Owczarz et al. | |
| 6,821,192 | B1* | 11/2004 | Donohue | B24B 37/32 |
| | | | | 451/285 |
| 8,033,895 | B2 | 10/2011 | Prabhu et al. | |
| 8,083,571 | B2 | 12/2011 | Nabeya et al. | |
| 8,858,302 | B2* | 10/2014 | Kim | B24B 37/32 |
| | | | | 451/364 |
| 9,368,371 | B2 | 6/2016 | Oh et al. | |
| 2006/0105678 | A1 | 5/2006 | Kohama et al. | |
| 2007/0049184 | A1* | 3/2007 | Venigalla | B24B 37/32 |
| | | | | 451/285 |
| 2008/0171494 | A1* | 7/2008 | Dube | B24B 57/02 |
| | | | | 451/60 |
| 2008/0199118 | A1* | 8/2008 | Yabe | F16C 41/007 |
| | | | | 252/62.54 |
| 2014/0154956 | A1 | 6/2014 | Lee et al. | |
| 2016/0271750 | A1* | 9/2016 | Hu | B24B 37/32 |
| 2017/0301563 | A1* | 10/2017 | Wu | H01L 21/6838 |
| 2018/0286699 | A1* | 10/2018 | Lin | B24B 37/044 |
| 2019/0099857 | A1* | 4/2019 | Oh | B24B 37/32 |
| 2020/0185231 | A1* | 6/2020 | Kim | H01L 21/3212 |

FOREIGN PATENT DOCUMENTS

| | | | | |
|---|---|---|---|---|
| GB | 2315694 | A * | 2/1998 | B24B 37/04 |
| JP | 2009-136979 | A | 6/2009 | |
| JP | 5355563 | B2 | 11/2013 | |
| JP | 6332592 | B2 | 5/2018 | |
| KR | 2001019987 | A * | 3/2001 | B08B 3/02 |
| KR | 10-1088785 | B1 | 11/2011 | |
| KR | 10-1186239 | B1 | 9/2012 | |
| WO | WO-0214015 | A1 * | 2/2002 | B24B 37/32 |

OTHER PUBLICATIONS

Machine Generated English Translation of description for KR2001019987 published Mar. 15, 2001. (Year: 2001).*

Figures of KR2001019987 published Mar. 15, 2001. (Year: 2001).*

* cited by examiner

CHEMICAL MECHANICAL POLISHING APPARATUS FOR CONTROLLING POLISHING UNIFORMITY

CROSS-REFERENCE TO RELATED APPLICATION

Korean Patent Application No. 10-2018-0158375, filed on Dec. 10, 2018, in the Korean Intellectual Property Office, and entitled: "Chemical Mechanical Polishing Apparatus for Controlling Polishing Uniformity," is incorporated by reference herein in its entirety.

BACKGROUND

1. Field

Embodiments relate to a chemical mechanical polishing (CMP) apparatus, and more particularly, to a CMP apparatus capable of controlling polishing uniformity.

2. Description of the Related Art

As the number of layers included in a structure of a semiconductor device has increased, a planarization process for planarizing a material layer, e.g., a metal layer or an insulating layer, which is formed on a wafer during manufacturing of a semiconductor device has been researched. For example, the planarization process may be performed by using a chemical mechanical polishing (CMP) apparatus.

SUMMARY

According to an aspect of embodiments, there is provided a CMP apparatus including a polishing pad on a polishing platen, a polishing head including a membrane configured to hold a wafer on the polishing pad and a polishing slurry feeding line configured to feed a polishing slurry, and a retainer ring around the membrane to contact the polishing pad to prevent detachment of the wafer and having a polishing slurry feeding inlet connected to the polishing slurry feeding line and configured to feed the polishing slurry onto the polishing pad.

According to another aspect of embodiments, there is provided a CMP apparatus including a polishing pad on a polishing platen, a polishing head including a membrane configured to hold a wafer on the polishing pad and a polishing slurry feeding line including a first auxiliary polishing slurry feeding line configured to feed a first auxiliary polishing slurry and a second auxiliary polishing slurry feeding line configured to feed a second auxiliary polishing slurry, and a retainer ring around the membrane to contact the polishing pad to prevent detachment of the wafer and having a first auxiliary polishing slurry feeding inlet configured to feed the first auxiliary polishing slurry onto the polishing pad and a second auxiliary polishing slurry feeding inlet configured to feed the second auxiliary polishing slurry onto the polishing pad.

According to another aspect of embodiments, there is provided a CMP apparatus including a polishing pad on a polishing platen, a first polishing slurry feeding line configured to feed a first polishing slurry onto the polishing pad, a polishing head including a membrane configured to hold a wafer on the polishing pad and a second polishing slurry feeding line configured to feed a second polishing slurry, and a retainer ring around the membrane to contact the polishing pad to prevent detachment of the wafer and having a polishing slurry feeding inlet around the wafer to feed the second polishing slurry so as to control a polishing rate of a material layer on an edge portion of the wafer.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
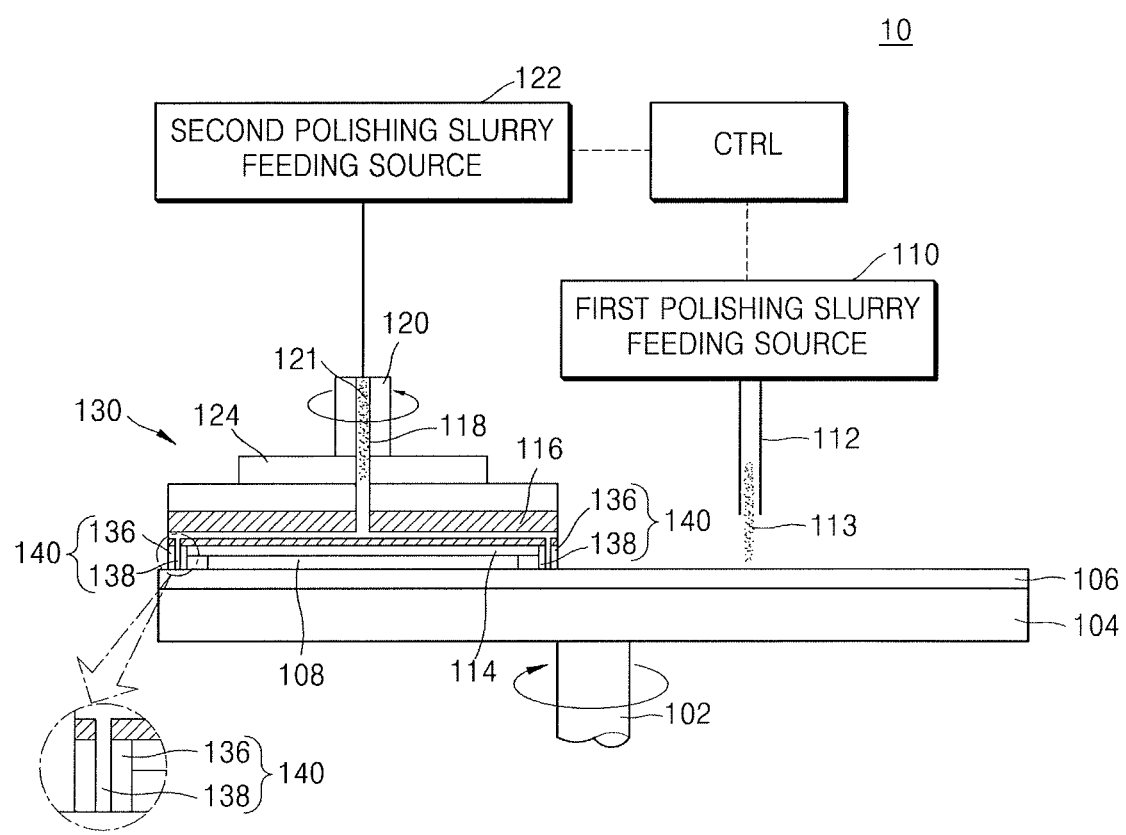
FIGS. 1 and 2 illustrate cross-sectional views of a chemical mechanical polishing (CMP) apparatus according to an embodiment.
Figure 2:
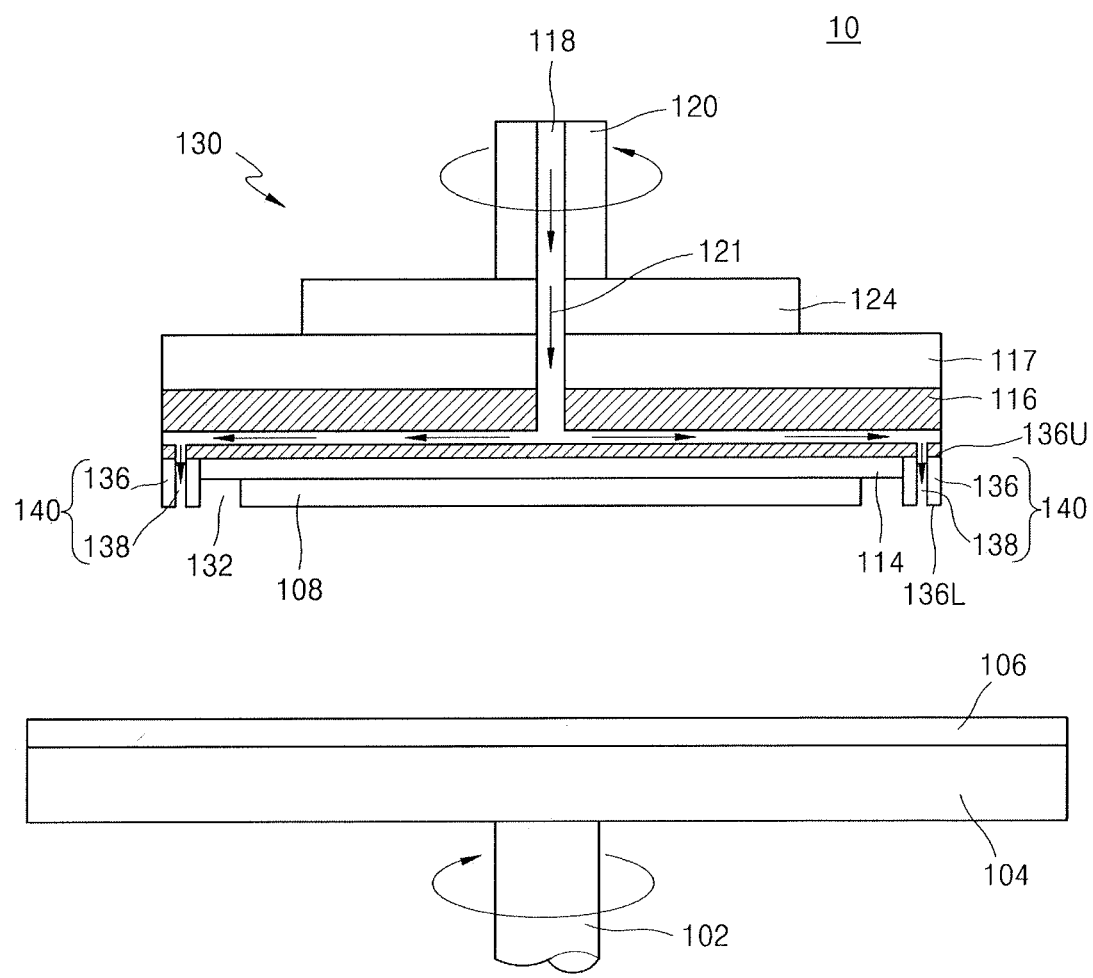

FIGS. 1 and 2 are cross-sectional views of a chemical mechanical polishing (CMP) apparatus 10 according to an embodiment. FIG. 2 is an enlarged and detailed view of a polishing head 130 of the CMP apparatus 10.

In detail, FIG. 1 is a view illustrating a state in which a polishing pad 106 and a wafer 108 in the polishing head 130 are in contact with each other, and FIG. 2 is a view for describing a state in which a polishing slurry is fed to a top surface of the polishing pad 106 through the polishing head 130.

The CMP apparatus 10 may chemically and mechanically polish a material layer formed on the wafer 108, e.g., a metal layer or an insulating layer, in a state in which the polishing pad 106 and the wafer 108 are in contact with each other as illustrated in FIG. 1. In this specification, the term "polishing" may be interpreted to denote chemical and mechanical polishing of the wafer 108 or chemical and mechanical polishing of a material layer on the wafer 108.

Referring to FIGS. 1 and 2, the CMP apparatus 10 may include a polishing platen 104, i.e., a polishing table, to which the polishing pad 106, to be used to polish the wafer 108 (e.g., having a diameter of about 300 mm), is coupled. The polishing platen 104 may be rotated by a first driving shaft 102, and thus, the polishing pad 106 may also be rotated in correspondence to the rotation of the polishing platen 104. For example, when the first driving shaft 102 rotates in a clockwise direction, the polishing platen 104 is rotated in the clockwise direction together with the polishing pad 106.

As illustrated in FIG. 1, a first polishing slurry feeding line 112 configured to feed a first polishing slurry 113 may be formed above the polishing pad 106. The first polishing slurry 113 may include an abrasive or a chemical solution including an abrasive particle. The first polishing slurry 113 may include, e.g., at least one of an abrasive, a passivator, an oxidizer, and a chelating agent.

The first polishing slurry 113 may be adjusted, e.g., a content of each of components therein, in order to control a polishing rate (or a removal rate) of the material layer on the wafer 108. For example, when the first polishing slurry 113 includes more of the abrasive and the oxidizer, the polishing rate of the material layer on the wafer 108 may be increased. When the first polishing slurry 113 includes more of the passivator, a passivation layer may be formed on the material layer when the material layer on the wafer 108 is polished, and thus, the polishing rate of the material layer on the wafer 108 may be decreased. Specific materials included in the abrasive, the passivator, the oxidizer, and the additive will be described below.

The first polishing slurry feeding line 112 may have a nozzle form. A first polishing slurry feeding source 110 may be connected to the first polishing slurry feeding line 112. The first polishing slurry 113 may be used for a main polishing operation of the wafer 108. The first polishing slurry 113 may be a slurry fed to the entire surface of the polishing pad 106.

The polishing head 130 may be configured to introduce the wafer 108 to be polished, and may be located on, e.g., above, the polishing pad 106. The wafer 108 may be attached to a bottom of the polishing head 130, i.e., to a surface of the polishing head 130 facing the polishing pad 106, so the wafer 108 and the polishing pad 106 may contact each other.

In detail, the polishing head 130 may include a head body portion 116, a membrane 114, a second polishing slurry feeding line 118, a pressure adjusting device 117, and a housing 124. A second driving shaft 120 may be connected to a top portion of the head body portion 116. The membrane 114 may be coupled to a bottom surface of the head body portion 116.

The membrane 114 may hold or release the wafer 108 at the bottom surface of the head body portion 116 via vacuum. The membrane 114 may contact the polishing pad 106 during the polishing operation. The head body portion 116 may be rotated by the second driving shaft 120, and thus, the polishing head 130 and the wafer 108 may also be rotated.

For example, the head body portion 116 may be rotated via the second driving shaft 120 rotating in an anti-clockwise direction unlike the first driving shaft 102. Thus, the polishing head 130 and the wafer 108 may also be rotated in the anti-clockwise direction. According to an embodiment, the first driving shaft 102 and the second driving shaft 120 may have the same rotation direction, or different rotation directions when necessary.

The pressure adjusting device 117 may control the polishing rate of the wafer 108 by increasing or decreasing air pressure with respect to the wafer 108 via the membrane 114. The housing 124 may be a member covering the pressure adjusting device 117 and/or the head body portion 116. The second polishing slurry feeding line 118 configured to feed a second polishing slurry 121 may be formed in the head body portion 116. A second polishing slurry feeding source 122 may be connected to the second polishing slurry feeding line 118.

The second polishing slurry 121 may be an abrasive or a chemical solution including an abrasive particle. The second polishing slurry 121 may include the same materials as the first polishing slurry 113. That is, the second polishing slurry 121 may include, e.g., at least one of an abrasive, a passivator, an oxidizer, and a chelating agent.

The abrasive may include at least one of, e.g., $SiO_2$, $CeO_2$, $ZrO_2$, $Al_2O_3$, $TiO_2$, $BaTiO_2$, $GeO_2$, $MnO_2$, $MgO_2$, and a blend thereof. The passivator may include at least one of, e.g., a cationic polymer, an anionic polymer, a non-ionic polymer, an amphoteric polymer, and a blend thereof. The oxidizer may include at least one of, e.g., a periodic acid, a hydrogenated peroxide, an ammonium persulfate nitric acid, ferric nitrate, and a blend thereof. The chelating agent may include at least one of, e.g., glycine, an amino acid, amino acid derivates, and a blend thereof.

The content of each component of the second polishing slurry 121 may be adjusted in order to control the polishing rate of the material layer on the wafer 108. For example, when the second polishing slurry 121 includes more of the abrasive or the oxidizer, the polishing rate of the material layer on the wafer 108 may be increased. When the second polishing slurry 121 includes more of the passivator, a passivation layer may be formed on the material layer on the wafer 108 when the material layer is polished, and thus, the polishing rate of the material layer may be decreased.

The second polishing slurry feeding line 118 may be formed in the head body portion 116 and may be formed in the second driving shaft 120, the housing 124, and the pressure adjusting device 117, e.g., along a central vertical axis thereof. For example, as illustrated in FIG. 2, the second polishing slurry feeding line 118 may, e.g., continuously, extend along a vertical direction through the second driving shaft 120, the housing 124, the pressure adjusting device 117, and a portion of the head body portion 116. For example, as further illustrated in FIG. 2, the vertical portion of the second polishing slurry feeding line 118 may extend into a horizontal portion within the head body portion 116, e.g., in parallel to the polishing platen 104, so the second polishing slurry 121 may flow along the direction of the arrows in FIG. 2 to be directed downward at an edge of the head body portion 116 to be connected to a polishing slurry feeding inlet 138 of a retainer ring 140.

The second polishing slurry 121 may be used to perform an auxiliary polishing operation of the wafer 108. The auxiliary polishing operation may be an operation of locally polishing the wafer 108 by locally feeding the second polishing slurry 121 onto the polishing pad 106 adjacently to the wafer 108, e.g., the second polishing slurry 121 may be locally applied only along edges of the wafer 108 through the slurry feeding inlet 138 of the retainer ring 140.

The retainer ring 140 may be formed at a bottom edge of the head body portion 116 of the polishing head 130. The retainer ring 140 may be coupled and assembled to the head body portion 116 of the polishing head 130. The retainer ring 140 may be formed to prevent the wafer 108 from being detached from the polishing pad 106 and to uniformly feed the second polishing slurry 121 during the auxiliary polishing operation.

In detail, the retainer ring 140 may include a ring-shaped body portion 136 coupled to a bottom portion of the head body portion 116 included in the polishing head 130, and the polishing slurry feeding inlet 138 formed in the ring-shaped body portion 136. The retainer ring 140 may feed the second polishing slurry 121 fed through the second polishing slurry feeding line 118 onto the polishing pad 106 through the polishing slurry feeding inlet 138. The shape and structure of the retainer ring 140 will be described in more detail below, with reference to FIGS. 3-5.

By rotating the polishing head 130, the CMP apparatus 10 may rotate the polishing head 130 and may minutely move the polishing head 130 on a central portion of the polishing pad 106 in a direction toward a side portion (an edge portion) of the polishing pad 106 or in a reverse way, for a uniform polishing operation of the wafer 108. The CMP apparatus 10 may feed the first polishing slurry 113 onto the entire surface of the polishing pad 106 through the first polishing slurry feeding line 112. Also, the CMP apparatus 10 may feed the second polishing slurry 121 onto the polishing pad 106 adjacently to the wafer 108, through the second polishing slurry feeding line 118, e.g., so the second polishing slurry 121 may be applied only along edges of the wafer 108, thereby chemically and mechanically polishing the wafer 108 coupled to a bottom surface of the polishing head 130. In other words, according to the CMP apparatus 10 of the exemplary embodiments, the first polishing slurry 113 and the second polishing slurry 121 may be fed onto the polishing pad 106 and the polishing platen 104, and the polishing head 130 may be selectively or simultaneously rotated, so that the wafer 108 in the polishing head 130 may be chemically and mechanically polished while being kept in contact with the polishing pad 106 by the retainer ring 140.

When the CMP apparatus 10 polishes the material layer on the wafer 108 as described above, the CMP apparatus 10 may control a feeding quantity or a composition of the first polishing slurry 113 and the second polishing slurry 121 fed onto the polishing pad 106, in order to decrease a difference and increase a polishing uniformity between polishing rates of the material layer on a central portion of the wafer 108 and the material layer on an edge portion of the wafer 108. For example, when a diameter of the wafer 108 is about 300 mm, the edge portion of the wafer 108 may denote a portion within a distance of about 10 mm from the edge of the wafer 108.

Furthermore, when the CMP apparatus 10 polishes the material layer on the wafer 108, the CMP apparatus 10 may improve the polishing uniformity throughout the entire surface of the wafer 108, by increasing or decreasing the polishing rate of the material layer on the edge portion of the wafer 108, e.g., only adjusting the polishing rate of the material layer at the edge portion of the wafer 108 relative to the polishing rate of the material layer at the central portion of the wafer 108, by controlling, e.g., adjusting, a feeding quantity or a composition of the second polishing slurry 121 fed onto the polishing pad 106 via a controller CTRL. For example, when the second polishing slurry 121 includes more of an abrasive or an oxidizer, the CMP apparatus 10 may increase the polishing rate of the material layer on the edge portion of the wafer 108 (relative to the central portion), and when the second polishing slurry 121 includes more of a passivator, the CMP apparatus 10 may decrease the polishing rate of the material layer on the edge portion of the wafer 108 (relative to the central portion). Accordingly, the CMP apparatus 10 may improve the polishing uniformity throughout the entire surface of the wafer 108, i.e., may minimize polishing differences between the edge and central portions of the wafer 108.

Figure 3:
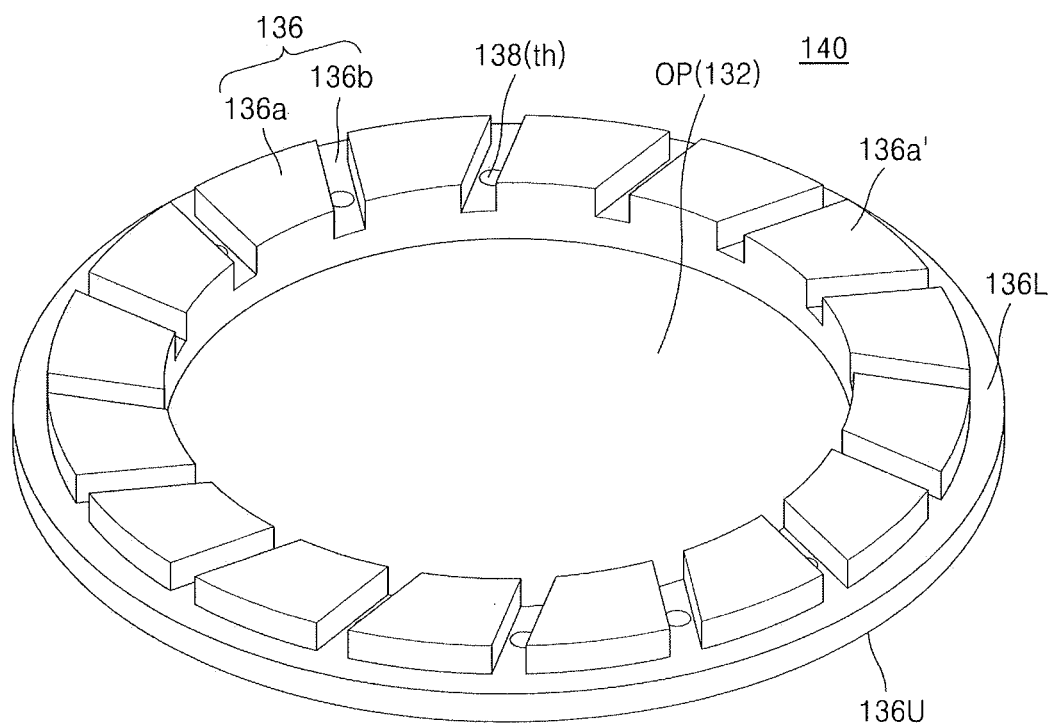
FIGS. 3 through 5 illustrate views of a retainer ring in the CMP apparatus of FIGS. 1-2, according to embodiments.
Figure 4:
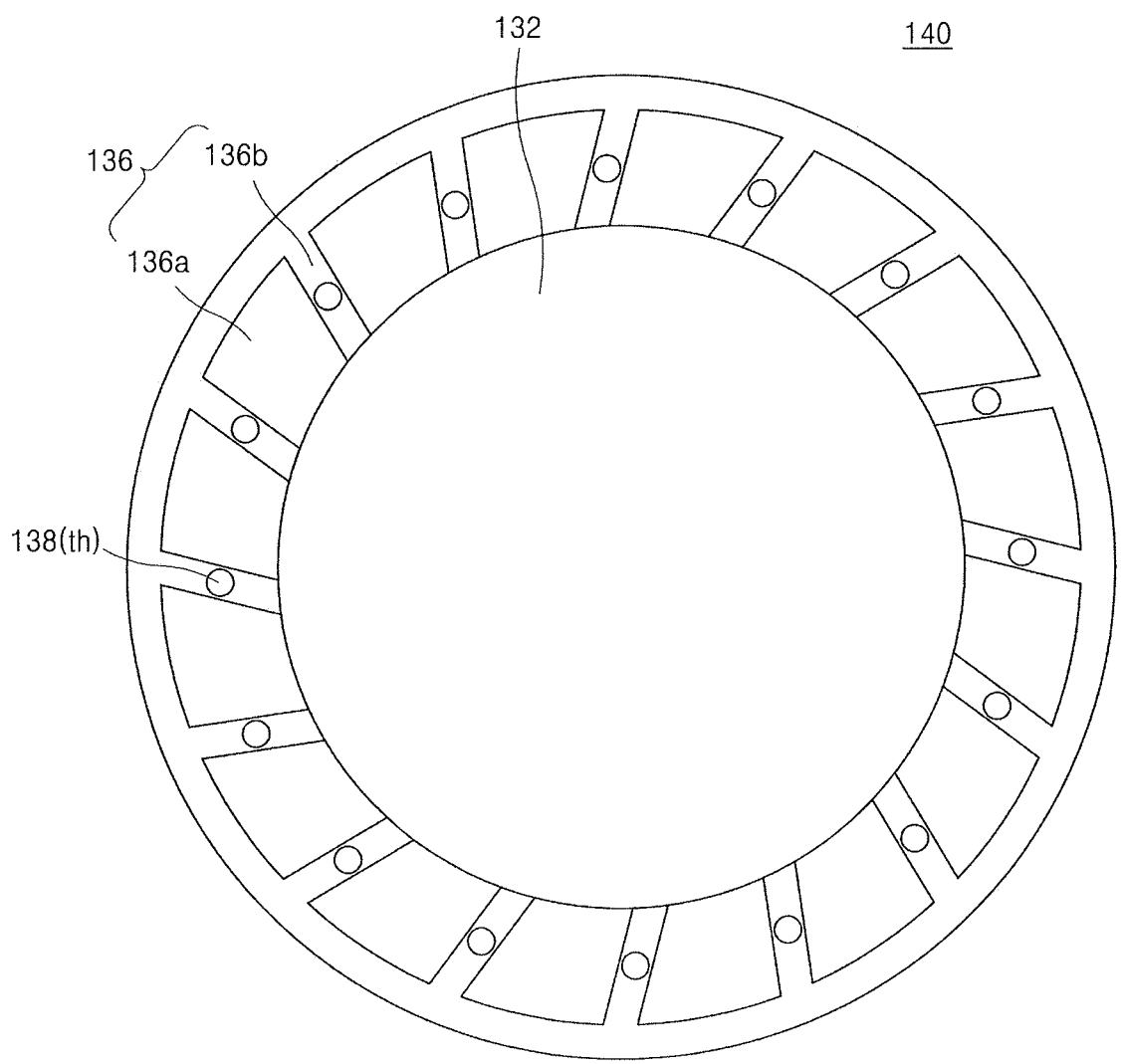
Figure 5:
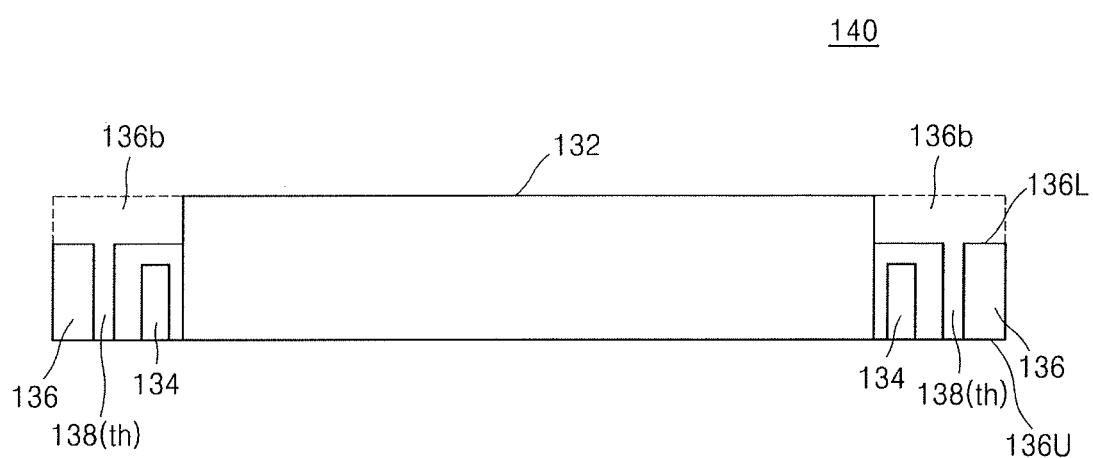

FIGS. 3 through 5 are views for describing the retainer ring 140 used for the CMP apparatus 10 of FIGS. 1 and 2, according to embodiments. In detail, FIG. 3 is a perspective view of the retainer ring 140, FIG. 4 is a bottom plan view of the retainer ring 140 (if looking from the polishing pad 106 in FIG. 2 toward the retainer ring 140), and FIG. 5 is a cross-sectional view of the retainer ring 140.

Referring to FIGS. 2-5, the ring-shaped body portion 136 of the retainer ring 140 may be coupled to a bottom portion of the polishing head 130, e.g., an upper surface 136U of the ring-shaped body portion 136 may be coupled to a bottom of the head body portion 116 of the polishing head 130 (FIG. 2). For example, a connection portion 134 which may be coupled to the polishing head 130 may be formed at a surface of the ring-shaped body portion 136 (FIG. 5), e.g., the connection portion 134 may couple the upper surface 136U of the ring-shaped body portion 136 to the polishing head 130. The ring-shaped body portion 136 may have a shape of a ring, e.g., the ring-shaped body portion 136 may surround an opening OP (FIG. 3), and a wafer retaining portion 132 configured to retain the wafer 108 may be located in the ring. For example, as illustrated in FIGS. 3-4, the wafer retaining portion 132 may be positioned in the opening OP surrounded by the ring-shaped body portion 136 to retain the wafer 108 in the retainer ring 140.

The ring-shaped body portion 136 may include a plurality of flow prevention bumps 136a configured to prevent the polishing slurry from flowing at a contact surface at which the ring-shaped body portion 136 contacts the polishing pad 106, and at least one flow groove 136b through which the polishing slurry may flow between the plurality of flow prevention bumps 136a. For example, as illustrated in FIG. 3, the flow prevention bumps 136a may be protrusions that extend from the lower surface 136L of the ring-shaped body portion 136 with spaces therebetween along the circumference of the ring-shaped body portion 136, and a plurality of flow grooves 136b may separate between adjacent flow prevention bumps 136a. For example, when the polishing pad 106 contacts the lowest surfaces 136a' of the flow prevention bumps 136a, the plurality of flow prevention bumps 136a of the ring-shaped body portion 136 may, e.g., directly, contact the polishing pad 106, so the polishing slurry may flow only through the flow grooves 136b.

In detail, the flow prevention bumps 136a may be a plurality of prevention slices separated from each other along a circumference of the ring-shaped body portion 136, e.g., the lowest surfaces 136a' of the flow prevention bumps 136a may be substantially level with each other. The flow groove 136b may be provided in a multiple number, e.g., the flow prevention bumps 136a and the flow grooves 136b may be arranged alternately along the circumference of the ring-shaped body portion 136. The flow groove 136b may be a groove connecting an inner circumference to an outer circumference of the ring-shaped body portion 136, e.g., a height of the flow groove 136b may be measured from the lower surface 136L of the ring-shaped body portion 136 to the lowest surfaces 136a' of the flow prevention bumps 136a. The flow groove 136b may be a groove formed along the outer circumference of the ring-shaped body portion 136. Shapes of the flow prevention bumps 136a and the flow groove 136b are not limited to the illustration of FIGS. 3 through 5, and the flow prevention bumps 136a and the flow groove 136b may have various shapes and arrangements.

The polishing slurry feeding inlet 138 may be provided in a multiple number along the ring-shaped body portion 136 to be apart from each other. The polishing slurry feeding inlet 138 may be a through-hole th penetrating the ring-shaped body portion 136. The through-hole th may be a hole penetrating a top surface and a bottom surface of the ring-shaped body portion 136, e.g., the through-hole th may penetrate lower and upper surfaces 136L and 136U of the ring-shaped body portion 136. The through-hole th may be provided in a multiple number to be apart from each other along the ring-shaped body portion 136. The through-hole th may be formed in the flow groove 136b, e.g., one through-hole th may vertically overlap each flow groove 136b (e.g., as illustrated in FIG. 5 where the flow groove 136b is illustrated with a dashed line), so the second polishing slurry 121 may flow through second polishing slurry feeding line 118 into the through-holes th of the polishing slurry feeding inlets 138 through the flow grooves 136b.

Figure 6A:
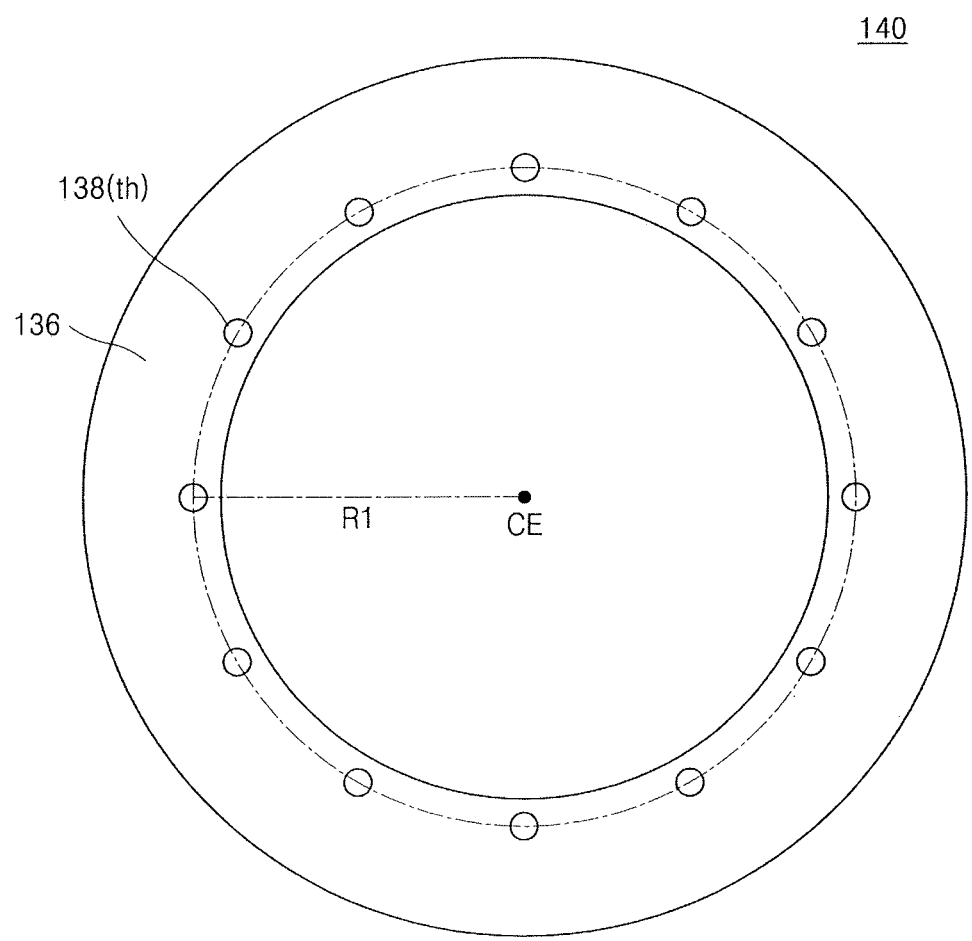
FIGS. 6A, 6B, 7A, and 7B illustrate views of a polishing slurry feeding inlet of the retainer ring used for the CMP apparatus of FIGS. 1-2, according to embodiments.
Figure 6B:
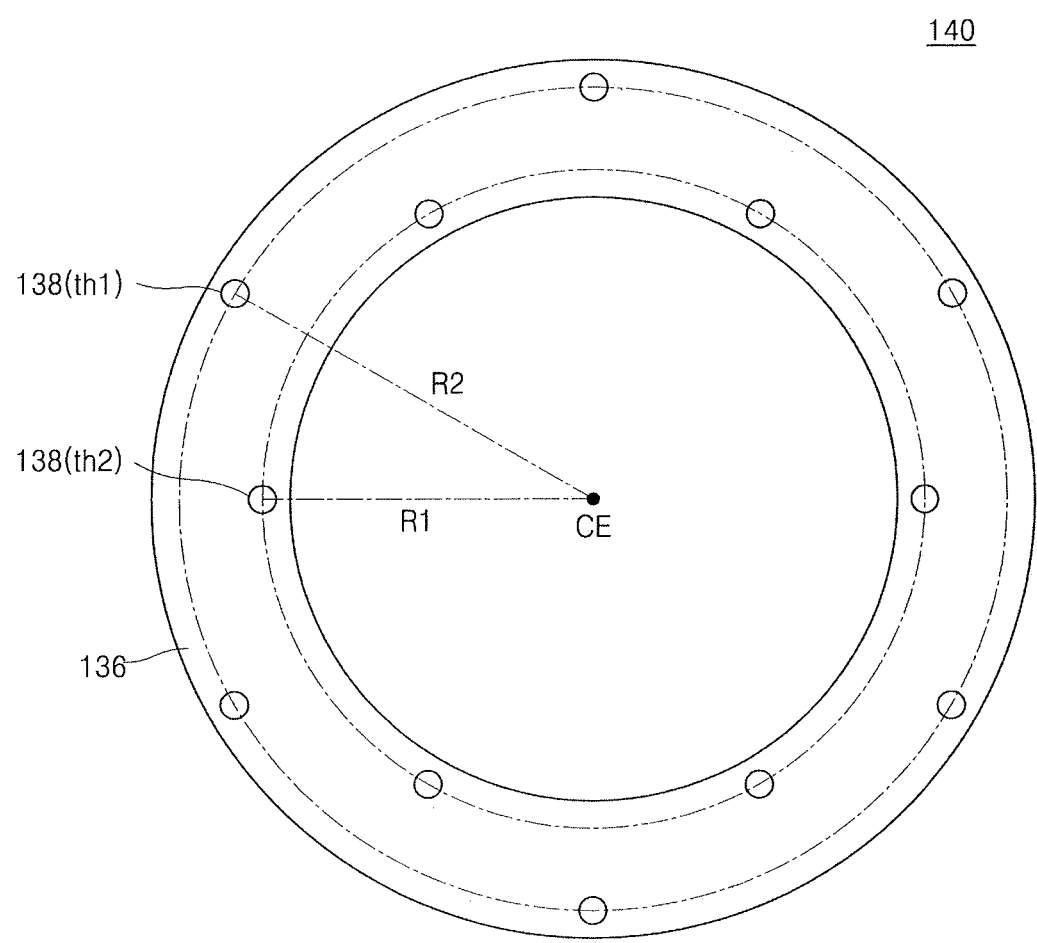
Figure 7A:
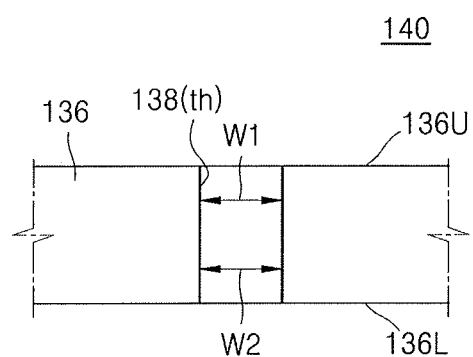
Figure 7B:
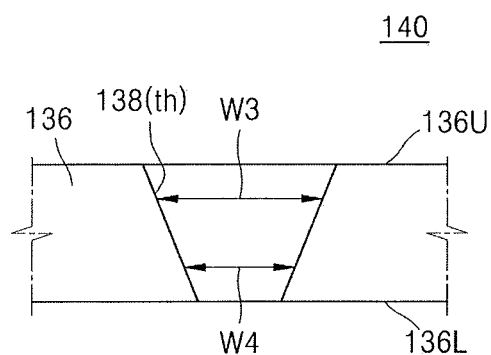

FIGS. 6A, 6B, 7A, and 7B are views for describing the polishing slurry feeding inlet 138 of the retainer ring 140 used for the CMP apparatus 10 of FIGS. 1 and 2. In detail, FIGS. 6A and 6B are plan views of the polishing slurry feeding inlet 138 of the retainer ring 140 and FIGS. 7A and 7B are cross-sectional views of the polishing slurry feeding inlet 138 of the retainer ring 140.

The polishing slurry feeding inlet 138 may be the through-hole th penetrating the ring-shaped body portion 136 as described above. As illustrated in FIGS. 6A and 6B, the through-hole th included in the polishing slurry feeding inlet 138 may be provided in a multiple number to be apart from each other along the circumference of the ring-shaped body portion 136. A planar shape of the through-hole th is illustrated as circular, but it may be oval or polygonal.

For example, as illustrated in FIG. 6A, all the through-holes th included in the polishing slurry feeding inlet 138 may be located within the same distance R1 from a central point CE of the ring-shaped body portion 136. In another example, as illustrated in FIG. 6B, the through-holes th included in the polishing slurry feeding inlet 138 may include first through-holes th1 and second through-holes th2 located within the distance R1 and a distance R2 from the central point CE of the ring-shaped body portion 136, respectively. The first through-holes th1 and the second through-holes th2 may be located within different distances from the central point CE of the ring-shaped body portion 136.

As illustrated in FIGS. 7A and 7B, the polishing slurry feeding inlet 138 may be the through-hole th penetrating a top portion and a bottom portion of the ring-shaped body portion 136, i.e., upper and lower surfaces 136U and 136L of the ring-shaped body portion 136. For example, as illustrated in FIG. 7A, an upper width W1 of the through-hole th may be the same as a bottom width W2 of the through-hole th. In another example, as illustrated in FIG. 7B, an upper width W3 of the through-hole th may be greater than a bottom width W4 of the through-hole th.

As described above, according to embodiments, the through-holes th, th1, and th2 included in the polishing slurry feeding inlet 138 of the retainer ring 140 may have various planar and cross-sectional shapes. Thus, a polishing slurry may be easily provided through the polishing slurry feeding inlet 138 in order to improve the polishing uniformity of the material layer on the wafer 108.

Figure 8:
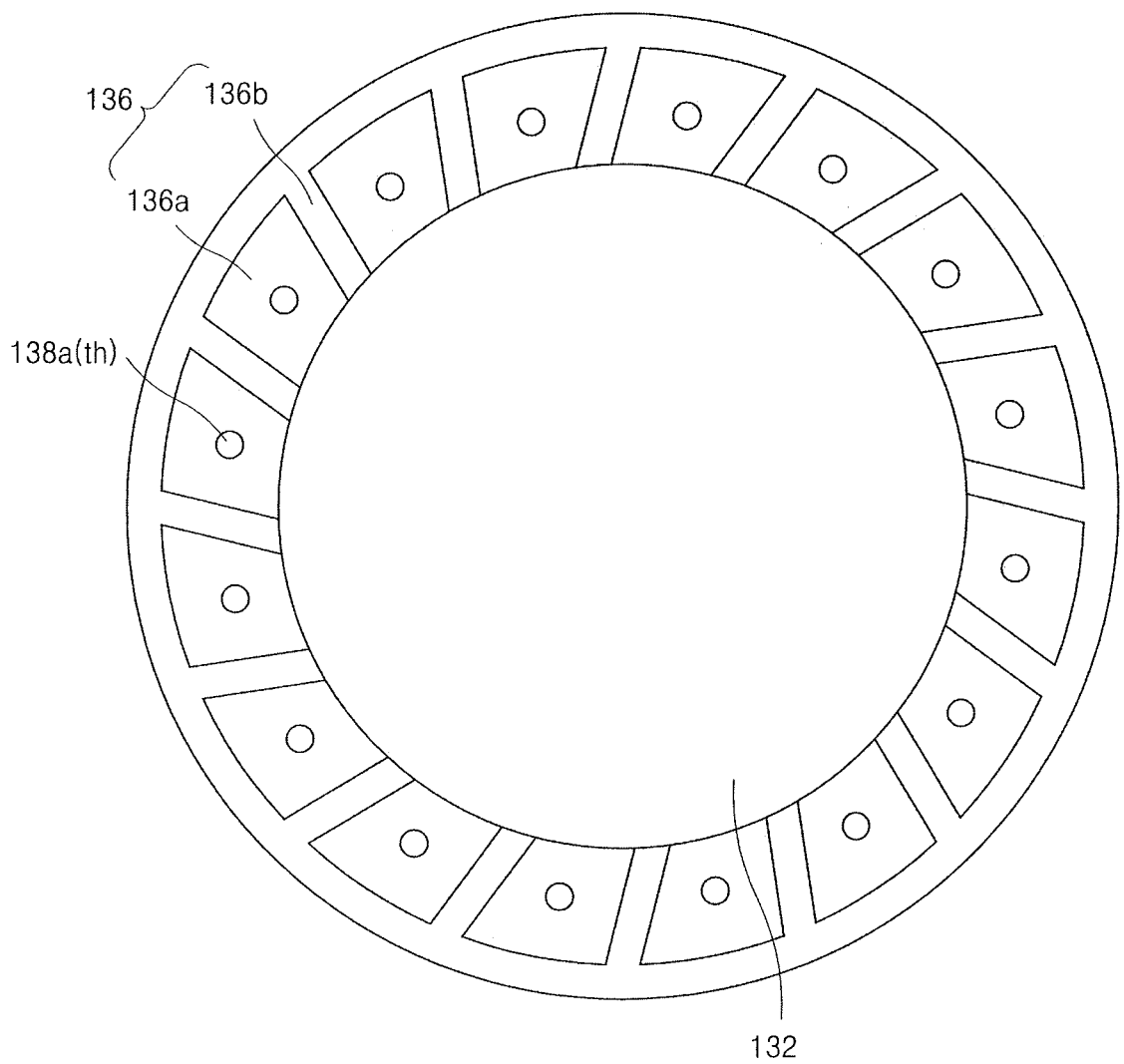
FIGS. 8 and 9 illustrate a plan view and a cross-sectional view, respectively, of a retainer ring in a CMP apparatus, according to embodiments.
Figure 9:
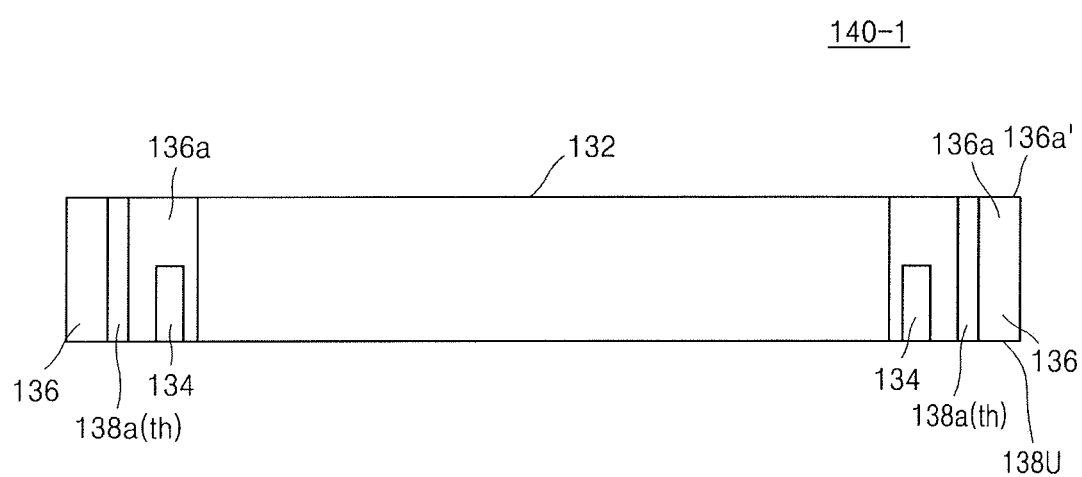

FIGS. 8 and 9 are respectively a plan view and a cross-sectional view of a retainer ring 140-1 used for the CMP apparatus 10, according to embodiments. The retainer ring 140-1 of FIGS. 8 and 9 may be the same as the retainer ring 140 of FIGS. 3 through 5, except that a polishing slurry feeding inlet 138a is formed at the flow prevention bumps 136a. In FIGS. 8 and 9, aspects that are the same as the aspects of FIGS. 3 through 5 will be only briefly described or omitted.

Referring to FIGS. 8 and 9, the retainer ring 140-1 may include the ring-shaped body portion 136 and the polishing slurry feeding inlet 138a. The connection portion 134, which may be coupled to the polishing head 130, may be formed at a surface of the ring-shaped body portion 136. The ring-shaped body portion 136 may have a shape of a ring, and the wafer retaining portion 132 configured to retain the wafer 108 may be located in the ring, i.e., surrounded by the ring-shaped body portion 136.

The ring-shaped body portion 136 may include the plurality of flow prevention bumps 136a configured to prevent the flow of a polishing slurry at a contact surface at which the ring-shaped body portion 136 contacts the polishing pad 106 and the flow groove 136b through which the polishing slurry may flow between the flow prevention bumps 136a.

The polishing slurry feeding inlet 138a may be provided in a multiple number along the ring-shaped body portion 136 to be apart from each other. The polishing slurry feeding inlet 138a may be the through-hole th penetrating the ring-shaped body portion 136, e.g., the through-hole th may be a hole penetrating a top surface and a bottom surface of the ring-shaped body portion 136.

The through-hole th may be provided in a multiple number to be apart from each other along the ring-shaped body portion 136. The through-hole th may be formed at the flow prevention bumps 136a. In other words, the through-hole th included in the polishing slurry feeding inlet 138a may be formed in the flow prevention bumps 136a. For example, as illustrated in FIGS. 8 and 9, the through-hole th may extend from the upper surface 136U of the ring-shaped body portion 136 to the lowest surfaces 136a' of the flow prevention bumps 136a, so the second polishing slurry 121 may flow through second polishing slurry feeding line 118 into the through-holes th of the polishing slurry feeding inlets 138 through the flow prevention bumps 136a.

As described above, according to embodiments, the through-holes th included in the polishing slurry feeding inlet 138a of the retainer ring 140-1 may be formed at the flow prevention bumps 136a, and thus, the polishing slurry may be easily fed through the polishing slurry feeding inlet 138a, in order to improve the polishing uniformity of the material layer on the wafer.

Figure 10:
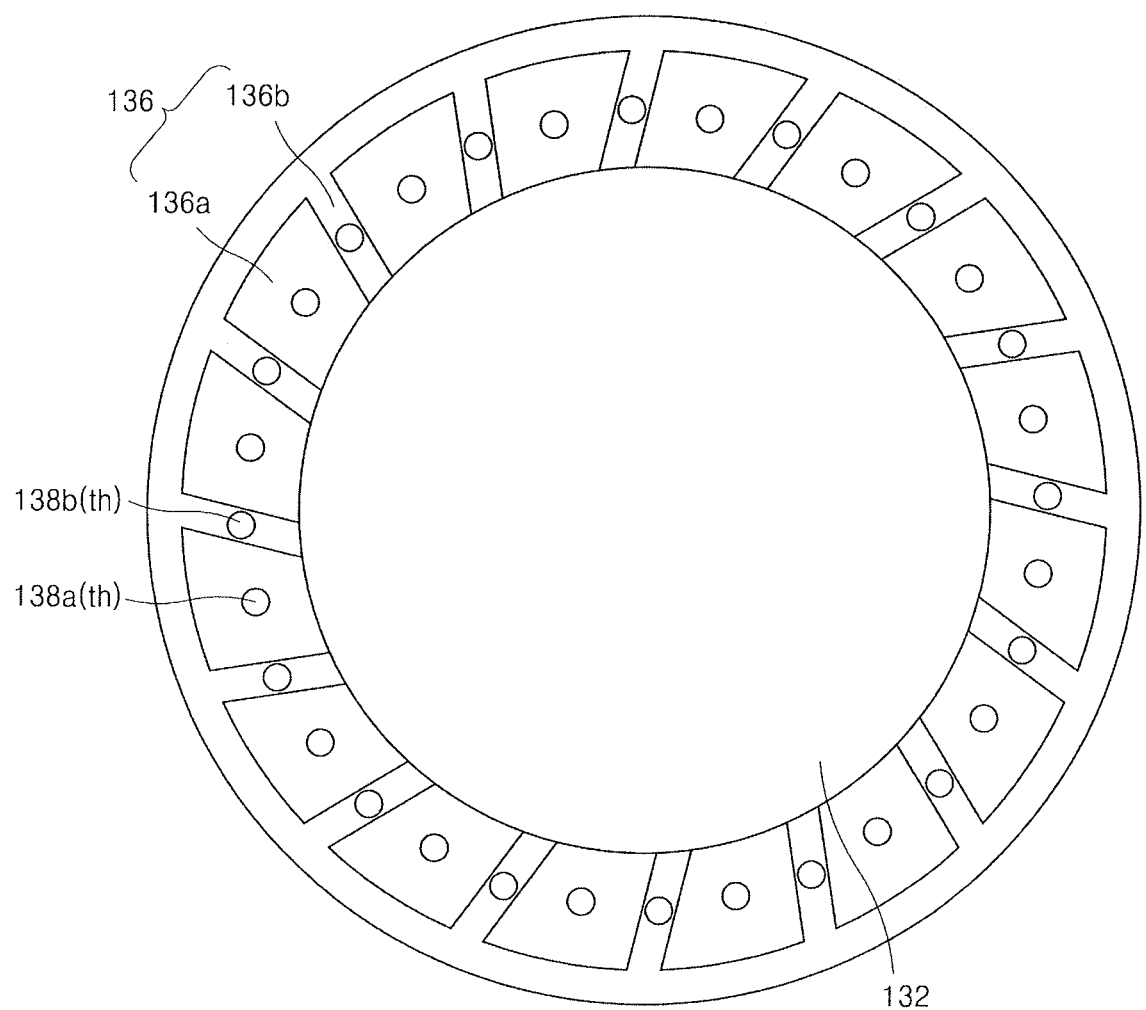
FIG. 10 illustrates a plan view of a retainer ring in a CMP apparatus, according to embodiments.

FIG. 10 is a plan view for describing a retainer ring 140-2 used for the CMP apparatus 10, according to embodiments. The retainer ring 140-2 of FIG. 10 may be the same as the retainer ring 140 of FIGS. 3 through 5 and the retainer ring 140-1 of FIGS. 8 and 9, except that polishing slurry feeding inlets 138a and 138b are formed at both of the flow prevention bumps 136a and the flow grooves 136b, respectively. In FIG. 10B, aspects that are the same as the aspects of FIGS. 3 through 5 and the aspects of FIGS. 8 and 9 will be only briefly described or omitted.

Referring to FIG. 10, the retainer ring 140-2 may include the ring-shaped body portion 136 and the polishing slurry feeding inlets 138a and 138b. The ring-shaped body portion 136 may have a shape of a ring, and the wafer retaining portion 132 configured to retain the wafer 108 may be located in the ring. The ring-shaped body portion 136 may include a plurality of flow prevention bumps 136a and the flow grooves 136b located between the plurality of flow prevention bumps 136a.

The polishing slurry feeding inlets 138a and 138b may be provided in a multiple number to be apart from each other along the ring-shaped body portion 136. The polishing slurry feeding inlets 138a and 138b may be through-holes th penetrating the ring-shaped body portion 136. The through-holes th may be formed at both of the flow prevention bumps 136a and the flow grooves 136b. In other words, the through-holes th included in the polishing slurry feeding inlets 138a and 138b may be formed both in the flow prevention bumps 136a and in the flow groove 136b.

As described above, according to embodiments, the retainer ring 140-2 may be formed in both of the flow prevention bumps 136a and the flow groove 136b. Thus, the polishing slurry may be relatively more easily fed through the polishing slurry feeding inlet 138a and 138b in order to improve the polishing uniformity of the material layer on the wafer.

Figure 11:
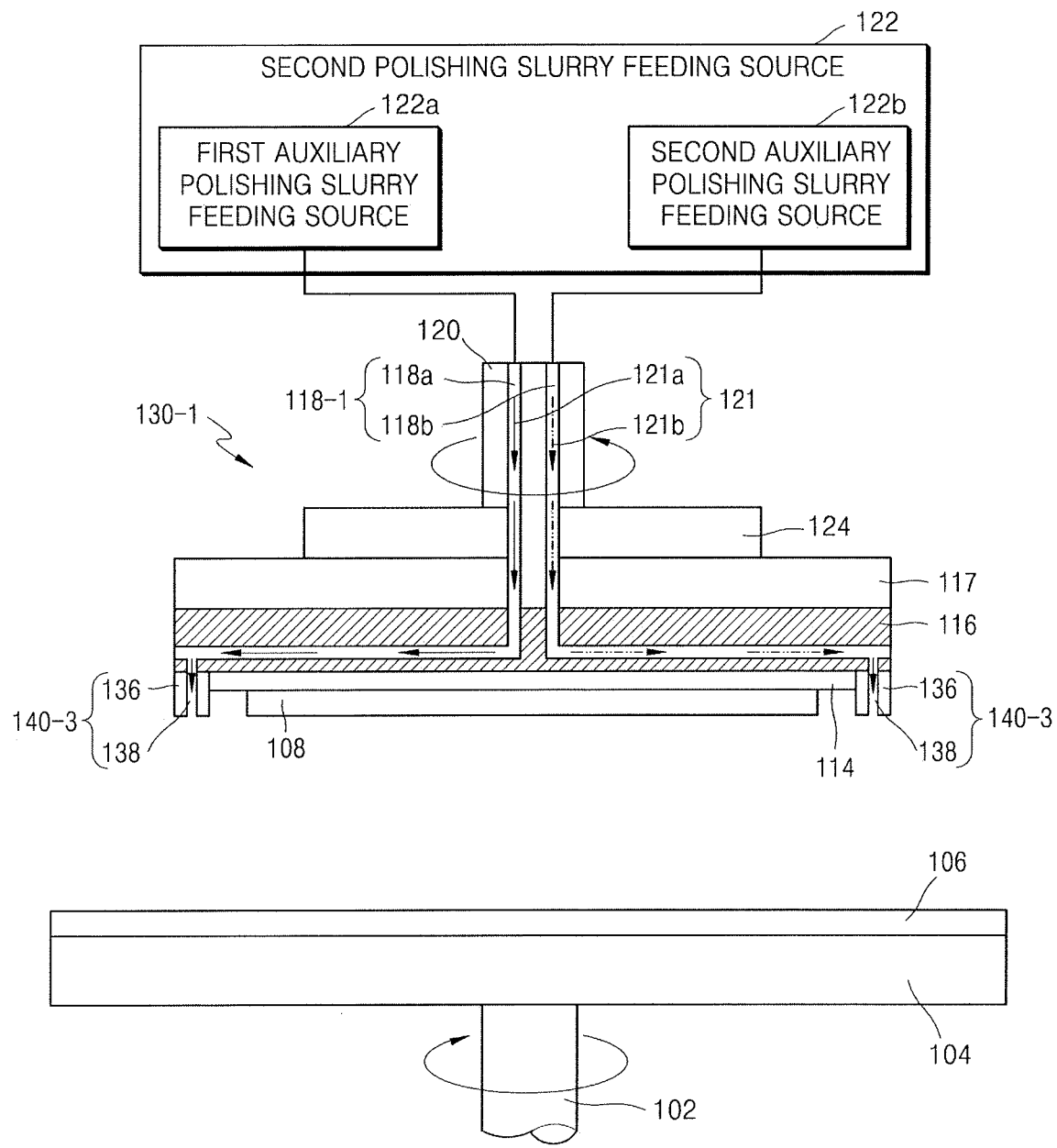
FIG. 11 illustrates a cross-sectional view of a CMP apparatus according to an embodiment.
Figure 12:
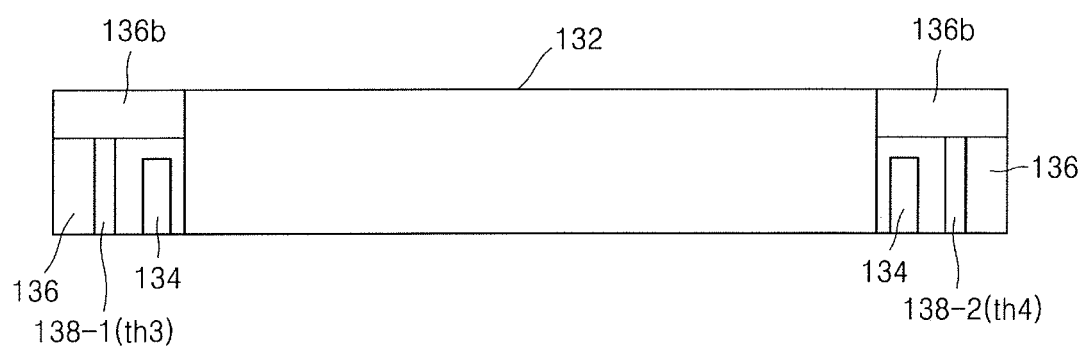
FIG. 12 illustrates a cross-sectional view of a retainer ring in the CMP apparatus of FIG. 11.

FIG. 11 is a cross-sectional view of a CMP apparatus 10-1 according to an embodiment. FIG. 12 is a cross-sectional view of a retainer ring 140-3 used for the CMP apparatus 10-1 of FIG. 11.

In detail, the CMP apparatus 10-1 of FIG. 11 may be the same as the CMP apparatus 10 of FIGS. 1 and 2, except that the second polishing slurry feeding source 122 includes a first auxiliary polishing slurry feeding source 122a and a second auxiliary polishing slurry feeding source 122b, and a second polishing slurry feeding line 118-1 includes a first auxiliary polishing slurry feeding line 118a and a second auxiliary polishing slurry feeding line 118b.

In addition, the retainer ring 140-3 of FIGS. 11 and 12 may be the same as the retainer ring 140 of FIGS. 3 through 5, except that the polishing slurry feeding inlet 138 includes a first auxiliary polishing slurry feeding inlet 138-1 and a second auxiliary polishing slurry feeding inlet 138-2. In FIGS. 11 and 12, like reference numerals refer to the like elements in FIGS. 1-5, and the same aspects will be only briefly described or omitted.

Referring to FIGS. 11-12, the CMP apparatus 10-1 may include the polishing platen 104 connected to the first driving shaft 102 and the polishing pad 106 located on the polishing platen 104. The polishing platen 104 may be rotated by the first driving shaft 102, and thus, the polishing pad 106 may also be rotated.

A polishing head 130-1 configured to introduce the wafer 108 to be polished may be located on the polishing pad 106. The polishing head 130-1 may include the head body portion 116, the membrane 114, the second polishing slurry feeding line 118-1, the pressure adjusting device 117, and the housing 124.

The second driving shaft 120 may be connected to a top portion of the head body portion 116. The head body portion 116 may be rotated by the second driving shaft 120, and thus, the polishing head 130-1 and the wafer 108 may also be rotated.

The second polishing slurry feeding line 118-1 configured to feed the second polishing slurry 121 may be formed at the head body portion 116. The second polishing slurry feeding line 118-1 may be formed in the head body portion 116 and may also be formed in the second driving shaft 120, the housing 124, and the pressure adjusting device 117.

The second polishing slurry feeding line 118-1 may include the first auxiliary polishing slurry feeding line 118a and the second auxiliary polishing slurry feeding line 118b configured to feed a first auxiliary polishing slurry 121a and a second auxiliary polishing slurry 121b, respectively. The first auxiliary polishing slurry feeding line 118a may feed the first auxiliary polishing slurry 121a from the first auxiliary polishing slurry feeding source 122a. The second auxiliary polishing slurry feeding line 118b may feed the second auxiliary polishing slurry 121b from the second auxiliary polishing slurry feeding source 122b. The first auxiliary polishing slurry 121a and the second auxiliary polishing slurry 121b may include at least one of the abrasives, the passivator, the oxidizer, and the chelating agent described above.

According to an embodiment, the first auxiliary polishing slurry 121a may be a slurry to increase a polishing rate of a material layer on the wafer 108. The first auxiliary polishing slurry 121a may include an abrasive or an oxidizer. The second auxiliary polishing slurry 121b may be a slurry to reduce the polishing rate of the material layer on the wafer 108. The second auxiliary polishing slurry 121b may include a passivator.

The first auxiliary polishing slurry 121a and the second auxiliary polishing slurry 121b may be used for an auxiliary polishing operation of the wafer 108. The auxiliary polishing operation may be performed such that the first auxiliary polishing slurry 121a and the second auxiliary polishing slurry 121b may be locally fed onto the polishing pad 106 adjacently to the wafer 108 to locally polish the material layer on the wafer 108.

The retainer ring 140-3 may be formed at a bottom edge portion of the head body portion 116 of the polishing head 130-1. The retainer ring 140-3 may feed the first auxiliary polishing slurry 121a and the second auxiliary polishing slurry 121b onto the polishing pad 106 through the second polishing slurry feeding line 118-1. The connection portion 134, which may be coupled to the polishing head 130-1, may be formed on a surface of the ring-shaped body portion 136.

The retainer ring 140-3 may include the polishing slurry feeding inlets 138-1 and 138-2 formed at the ring-shaped body portion 136. The polishing slurry feeding inlets 138-1 and 138-2 may include the first auxiliary polishing slurry feeding inlet 138-1 and the second auxiliary polishing slurry feeding inlet 138-2.

The first auxiliary polishing slurry feeding inlet 138-1 and the second auxiliary polishing slurry feeding inlet 138-2 may be a first through-hole th3 and a second through-hole th4, respectively, which penetrate the ring-shaped body portion 136. The first and second through-holes th3 and th4 may be holes penetrating a top surface and a bottom surface of the ring-shaped body portion 136. The first and second through-holes th3 and th4 may be formed in the flow groove 136b.

The first auxiliary polishing slurry 121a fed through the first auxiliary polishing slurry feeding line 118a may be fed onto the polishing pad 106 through the first auxiliary polishing slurry feeding inlet 138-1. The second auxiliary polishing slurry 121b fed through the second auxiliary polishing slurry feeding line 118b may be fed onto the polishing pad 106 through the second auxiliary polishing slurry feeding inlet 138-2.

The CMP apparatus 10-1 according to embodiments as described above may feed any one or both of the first auxiliary polishing slurry 121a and the second auxiliary polishing slurry 121b onto the polishing pad 106 through the first auxiliary polishing slurry feeding inlet 138-1 and the second auxiliary polishing slurry feeding inlet 138-2. Accordingly, the CMP apparatus 10-1 may easily reduce a difference between the polishing rates of the material layer at the central and edge portions of the wafer 108 by controlling the polishing rate of the material layer at the edge portion of the wafer 108, thereby improving the polishing uniformity of the entire surface of the wafer 108.

Figure 13:
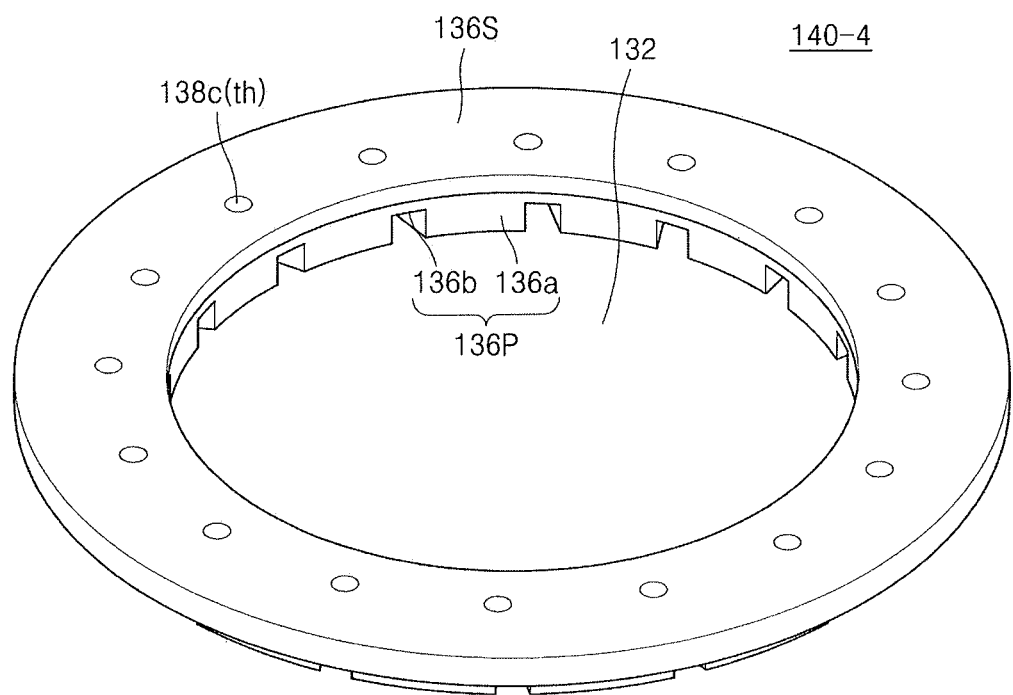
FIGS. 13 and 14 illustrate a perspective view and a cross-sectional view, respectively, of a retainer ring in a CMP apparatus, according to embodiments.
Figure 14:
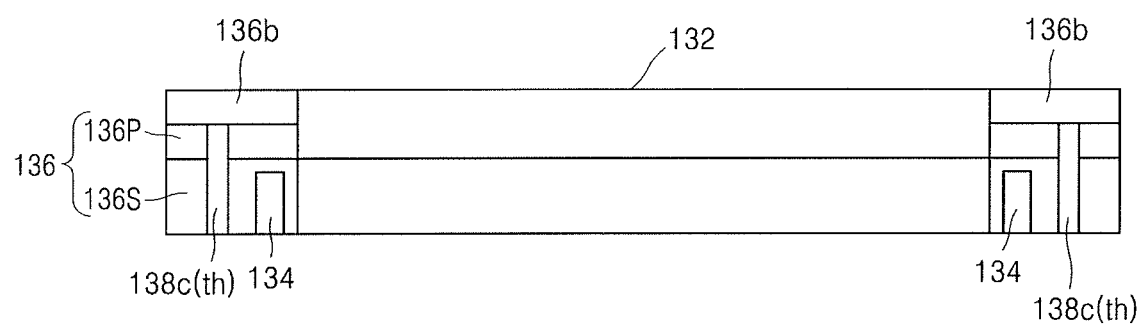

FIGS. 13 and 14 are a perspective view and a cross-sectional view, respectively, for describing a retainer ring 140-4 used for the CMP apparatuses 10 and 10-1, according to embodiments. In detail, the retainer ring 140-4 may be the same as the retainer rings 140, 140-1, 140-2, and 140-3, except that the ring-shaped body portion 136 includes a first ring-shaped body portion 136S and a second ring-shaped body portion 136P.

In FIGS. 13 and 14, aspects that are the same as the aspects of the retainer rings 140, 140-1, 140-2, and 140-3 described above will be only briefly described or omitted. In FIG. 13, the connection portion 134 formed on a surface of the ring-shaped body portion 136 to be coupled to the polishing head is not illustrated for convenience.

Referring to FIGS. 13-14, the retainer ring 140-4 may include the ring-shaped body portion 136 and a polishing slurry feeding inlet 138c. The ring-shaped body portion 136 may include the first ring-shaped body portion 136S coupled to a bottom portion of the polishing head and the second ring-shaped body portion 136P coupled to the first ring-shaped body portion 136S and contacting the polishing pad. For example, the first ring-shaped body portion 136S may include a metal material, and the second ring-shaped body portion 136P may include a plastic material.

The connection portion 134, which may be coupled to the polishing head, may be formed on a surface of the first ring-shaped body portion 136S. The first ring-shaped body portion 136S may have a shape of a ring, and the wafer retaining portion 132 configured to retain the wafer may be located in the ring. The second ring-shaped body portion 136P may include the plurality of flow prevention bumps 136a configured to prevent the polishing slurry from flowing at a contact surface at which the second ring-shaped body portion 136P contacts the polishing pad, and the flow groove 136b through which the polishing slurry may flow between the plurality of flow prevention bumps 136a.

The polishing slurry feeding inlet 138c may be provided in a multiple number to be apart from each other along the ring-shaped body portion 136. The polishing slurry feeding inlet 138c may be a through-hole th penetrating the ring-shaped body portion 136. The through-hole th may be a hole penetrating a top surface and a bottom surface of the ring-shaped body portion 136.

The through-hole th may be provided in a multiple number to be apart from each other along the ring-shaped body portion 136. The through-hole th may be formed at the flow groove 136b. In other words, the through-hole th included in the polishing slurry feeding inlet 138c may be formed in the flow groove 136b.

As described above, the retainer ring 140-4 may include the first ring-shaped body portion 136S including a metal material and the second ring-shaped body portion 136P including a plastic material. Thus, the polishing slurry may be easily fed through the polishing slurry feeding inlet 138c, and the polishing uniformity of the material layer on the wafer may be improved.

Figure 15:
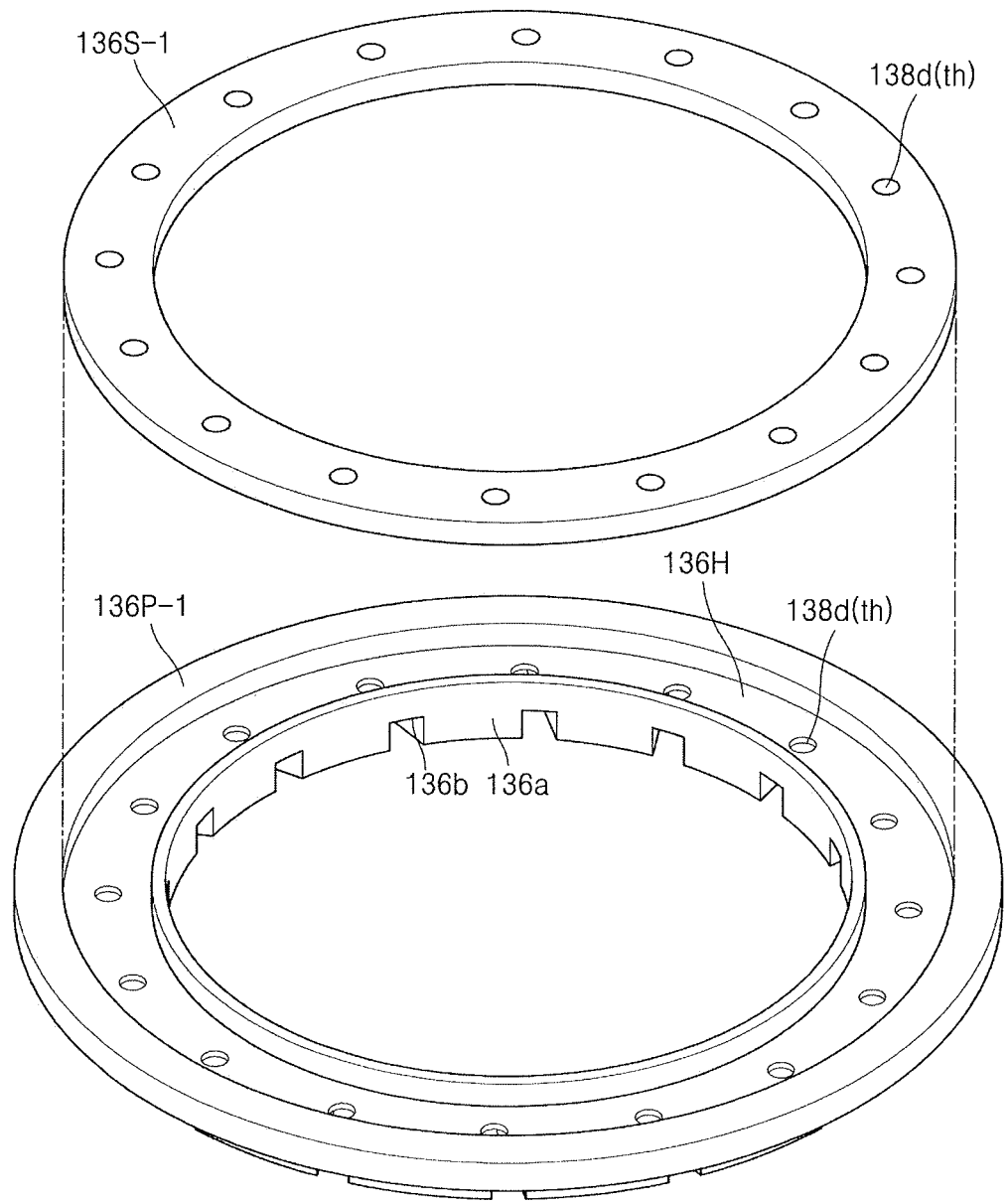
FIGS. 15 and 16 illustrate an exploded perspective view and a cross-sectional view, respectively, of a retainer ring in a CMP apparatus, according to embodiments.
Figure 16:
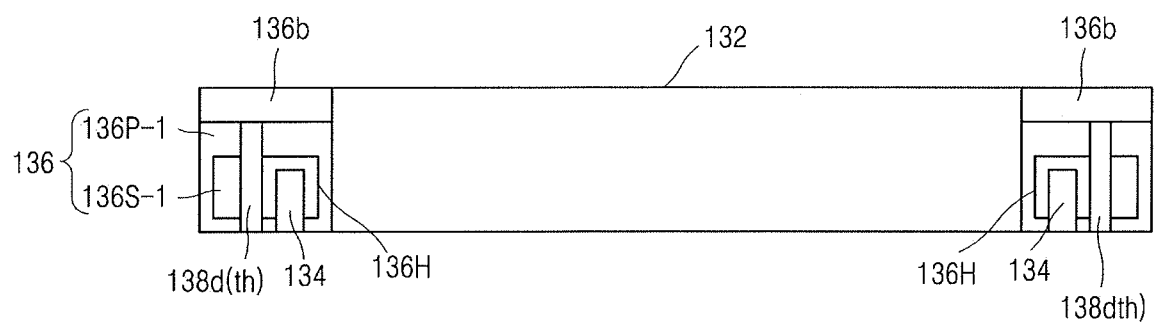

FIGS. 15 and 16 are respectively an exploded perspective view and a cross-sectional view of a retainer ring 140-5 used for the CMP apparatuses 10 and 10-1, according to embodiments. In detail, the retainer ring 140-5 may be the same as the retainer rings 140, 140-1, 140-2, and 140-3 described above, except that the ring-shaped body portion 136 includes a first ring-shaped body portion 136S-1 and a second ring-shaped body portion 136P-1.

In FIGS. 15 and 16, aspects that are the same as the aspects of the retainer rings 140, 140-1, 140-2, and 140-3 will be only briefly described or omitted. In FIG. 15, the connection portion 134 formed on a surface of the ring-shaped body portion 136 to be coupled to the polishing head is not illustrated, for convenience.

Referring to FIGS. 15-16, the retainer ring 140-5 may include the ring-shaped body portion 136 and a polishing slurry feeding inlet 138d. The ring-shaped body portion 136 may include the first ring-shaped body portion 136S-1 coupled to a bottom portion of the polishing head, and the second ring-shaped body portion 136P-1 having a mounting groove 136H which may be coupled to the first ring-shaped body portion 136S-1. The second ring-shaped body portion 136P-1 may contact the polishing pad. The first ring-shaped body portion 136S-1 may include a metal material, and the second ring-shaped body portion 136P-1 may include a plastic material.

The connection portion 134, which may be coupled to the polishing head, may be formed on a surface of the first ring-shaped body portion 136S-1. The ring-shaped body portion 136 may have a shape of a ring, and the wafer retaining portion 132 configured to retain the wafer may be located in the ring. The second ring-shaped body portion 136P-1 may include the plurality of flow prevention bumps 136a configured to prevent a polishing slurry from flowing at a contact surface at which the second ring-shaped body portion 136P-1 contacts the polishing pad, and the flow groove 136b through which the polishing slurry may flow between the plurality of flow prevention bumps 136a.

The polishing slurry feeding inlet 138d may be provided in a multiple number to be apart from each other along the ring-shaped body portion 136. The polishing slurry feeding inlet 138d may be a through-hole th penetrating the ring-shaped body portion 136. The through-hole th may be a hole penetrating a top surface and a bottom surface of the ring-shaped body portion 136. The through-hole th may be provided in a multiple number to be apart from each other along the ring-shaped body portion 136. The through-hole th may be formed at the flow groove 136b. In other words, the through-hole th included in the polishing slurry feeding inlet 138d may be formed in the flow groove 136b.

As described above, the retainer ring 140-5 may include the first ring-shaped body portion 136S-1 including a metal material and the second ring-shaped body portion 136P-1 including a plastic material. Thus, the polishing slurry may be easily fed through the polishing slurry feeding inlet 138d and the polishing uniformity of the material layer on the wafer may be improved.

Figure 17:
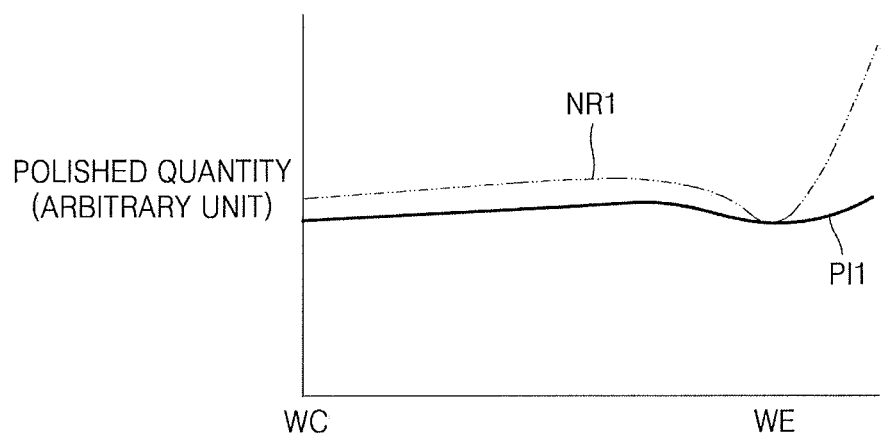
FIG. 17 illustrates a graph of a polished quantity of a material layer based on a location of a wafer, when the wafer is polished by a CMP apparatus according to embodiments.

FIG. 17 is a graph illustrating a polished quantity of a material layer based on a location of the wafer, when the material layer on the wafer is polished by using a CMP apparatus, according to embodiments.

Referring to FIG. 17, PI1 (solid line) indicates the polished quantity of the material layer, e.g., an oxidized layer or a metal layer, based on a location of the wafer. NR1 (dashed line) indicates a polished quantity of the material layer based on a location of the wafer according to a comparative embodiment. Further, WC and WE indicate a center of a wafer and an edge of a wafer, respectively. Thus, the curves PI1 and NR1 trace the polished quantity of the material layer as the center location WC changes to the edge location WE.

In detail, as indicated by NR1, there may be a difference between the polished quantity of the material layer on a central portion WC of the wafer and the polished quantity of the material layer on an edge portion WE of the wafer. For example, as indicated by NR1, the polished quantity of the material layer on the edge portion WE of the wafer may be greater than the polished quantity of the material layer on the central portion WC of the wafer. As described above, when the diameter of the wafer is about 300 mm, the edge portion WE of the wafer may denote a portion of the wafer within about 10 mm from the edge of the wafer.

In contrast, according to embodiments and as illustrated in FIG. 17, as indicated by PI1, the polished quantity of the material layer may have a reduced difference between the central portion WC of the wafer and the edge portion WE of the wafer. Thus, the polishing uniformity may be improved.

For example, as indicated by PI1, the polished quantity of the material layer on the edge portion WE of the wafer may be controlled to be decreased, in order to improve the polishing uniformity of the material layer on the wafer.

Figure 18:
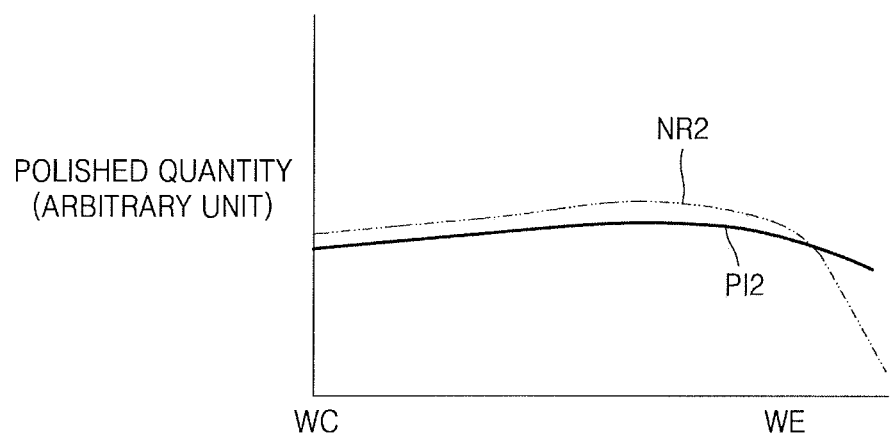
FIG. 18 illustrates a graph of a polished quantity of a material layer based on a location of a wafer, when the material layer on the wafer is polished by a CMP apparatus according to embodiments.

FIG. 18 is a graph illustrating a polished quantity of a material layer based on a location of a wafer, when the material layer on the wafer is polished by using a CMP apparatus, according to embodiments.

Referring to FIG. 18, PI2 (solid line) indicates the polished quantity of the material layer based on a location of the wafer, according to embodiments. NR2 (dashed line) indicates the polished quantity of the material layer based on a location of the wafer according to a comparative embodiment. As indicated by NR2, there may be a difference between the polished quantity of the material layer on the central portion WC of the wafer and the polished quantity of the material layer on the edge portion WE of the wafer.

For example, as indicated by NR2, the polished quantity of the material layer on the edge portion WE of the wafer may be less than the polished quantity of the material layer on the central portion WC of the wafer. As described above, when the diameter of the wafer is about 300 mm, the edge portion WE of the wafer may denote a portion within about 10 mm from the edge of the wafer.

In contrast, according to embodiments, as indicated by PI2, the polished quantity of the material layer may have a reduced difference between the central portion WC of the wafer and the edge portion WE of the wafer, and thus, the polishing uniformity may be improved. For example, as indicated by PI2, the polished quantity of the material layer on the edge portion WE of the wafer may be controlled to be increased, in order to improve the polishing uniformity of the material layer on the wafer.

Operation of the CMP apparatus described above, e.g., with respect to operation of the controller controlling the polishing head, the feed lines, and adjusting the slurry, may be performed by code or instructions to be executed by a computer, processor, manager, or controller. The computer, processor, controller, or other signal processing device may be those described herein or one in addition to the elements described herein. Any convenient algorithms that form the basis of the operations of the computer, processor, or may be used, and the code or instructions for implementing the operations of the embodiments may transform the computer, processor, controller, or other signal processing device into a special-purpose processor for performing the methods described herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, or controller which is to execute the code or instructions for performing the method embodiments described herein.

By way of summation and review, as the size of a wafer increases, it may be hard to control the polishing uniformity of the material layer on the wafer, when planarizing the material layer by using a CMP apparatus. Therefore, embodiments provide a CMP apparatus capable of controlling the polishing uniformity of a material layer on a wafer.

That is, according to embodiments, the retainer ring of the CMP apparatus provides an additional polishing slurry feeding inlet in the ring-shaped body portion of the retainer ring, thereby locally adjusting the polishing rate at the edge of the wafer. As such, there may be a reduced difference between polishing rates at the center and edge portions of a wafer, thereby improving polishing uniformity of the wafer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A chemical mechanical polishing (CMP) apparatus, comprising:
a polishing pad on a polishing platen;
a polishing head on the polishing pad, the polishing head including:
a membrane to hold a wafer on the polishing pad, and
a polishing slurry feeding line to feed a polishing slurry; and
a retainer ring around the membrane and in contact with the polishing pad to prevent detachment of the wafer, the retainer ring including:
a first ring-shaped body portion coupled to a bottom portion of the polishing head,
flow prevention bumps extending from the first ring-shaped body portion, the flow prevention bumps being protrusions extending from the ring-shaped body portion and spaced apart from each other in a shape of a circle having an outer diameter smaller than an outer diameter of the sing-shaped body portion, and the flow prevention bumps being configured to prevent the polishing slurry from flowing at a contact surface with the polishing pad,
a flow groove between adjacent ones of the flow prevention bumps, and
a polishing slurry feeding inlet connected to the polishing slurry feeding line to feed the polishing slurry onto the polishing pad, the polishing slurry feeding inlet directly facing a top surface of the polishing pad.

2. The CMP apparatus as claimed in claim 1, wherein:
the polishing slurry feeding inlet includes a through-hole penetrating a top surface and a bottom surface of the first ring-shaped body portion, the through-hole extending continuously from the top surface to the bottom surface of the first ring-shaped body portion and overlapping the flow groove, and
the flow groove extends continuously from an inner diameter to the outer diameter of the circle of the flow prevention bumps.

3. The CMP apparatus as claimed in claim 2, wherein, in a cross-sectional view of the through-hole, a top width of the through-hole within the first ring-shaped body portion is greater than a bottom width of the through-hole within the first ring-shaped body portion.

4. The CMP apparatus as claimed in claim 2, wherein the through-hole is provided as a plurality of through-holes along the first ring-shaped body portion, the plurality of through-holes being within a same distance from a central point of the first ring-shaped body portion.

5. The CMP apparatus as claimed in claim 2, wherein the through-hole is provided as a plurality of through-holes along the first ring-shaped body portion, the plurality of through-holes being within different distances from a central point of the first ring-shaped body portion.

6. The CMP apparatus as claimed in claim 1, wherein the polishing slurry feeding line is in fluid communication with the polishing slurry feeding inlet and the polishing pad, and the polishing slurry includes at least one of an abrasive, a passivator, an oxidizer, and a chelating agent.

7. The CMP apparatus as claimed in claim 1, wherein the polishing head includes a head body portion, the polishing slurry feeding line extending through the head body portion.

8. The CMP apparatus as claimed in claim 1, wherein the polishing slurry feeding inlet overlaps and extends through at least one of the flow groove and the flow prevention bumps.

9. The CMP apparatus as claimed in claim 1, wherein the retainer ring further includes:
a second ring-shaped body portion coupled to the first ring-shaped body portion and contacting the polishing pad, the polishing slurry feeding inlet includes a through-hole penetrating the first ring-shaped body portion and the second ring-shaped body portion.

10. The CMP apparatus as claimed in claim 9, wherein the first ring-shaped body portion includes a metal material and the second ring-shaped body portion includes a plastic material.

11. The CMP apparatus as claimed in claim 9, wherein the second ring-shaped body portion includes a mounting groove, the first ring-shaped body portion being mounted in the mounting groove.

12. The CMP apparatus as claimed in claim 1, wherein the polishing slurry feeding line includes first and second auxiliary polishing slurry feeding lines connected to different slurry sources, both the first and second auxiliary polishing slurry feeding lines extending through the polishing head.

13. The CMP apparatus as claimed in claim 1, further comprising an additional polishing slurry feeding line external to the polishing head and directly facing the polishing pad, the polishing slurry feeding inlet connecting the polishing slurry feeding line to the polishing pad.

14. A chemical mechanical polishing (CMP) apparatus, comprising:
a polishing pad on a polishing platen;
a polishing head on the polishing pad, the polishing head including:
a membrane to hold a wafer on the polishing pad, and
a polishing slurry feeding line having a first auxiliary polishing slurry feeding line to feed a first auxiliary polishing slurry and a second auxiliary polishing slurry feeding line configured to feed a second auxiliary polishing slurry; and
a retainer ring around the membrane and in contact with the polishing pad to prevent detachment of the wafer, the retainer ring including:
a first ring-shaped body portion coupled to a bottom portion of the polishing head,
flow prevention bumps extending from the first ring-shaped body portion, the flow prevention bumps being protrusions extending from the ring-shaped body portion and spaced apart from each other in a shape of a circle having an outer diameter smaller than an outer diameter of the sing-shaped body portion,
a flow groove between adjacent ones of the flow prevention bumps, and
first and second auxiliary polishing slurry feeding inlets connected to the first and second auxiliary polishing slurry feeding lines, respectively, and the first and second auxiliary polishing slurry feeding inlets directly facing a top surface of the polishing pad.

15. The CMP apparatus as claimed in claim 14, wherein the first auxiliary polishing slurry fed through the first auxiliary polishing slurry feeding line is connected to a first slurry source, and the second auxiliary polishing slurry fed through the second auxiliary polishing slurry is connected to a second slurry source different from the first slurry source.

16. The CMP apparatus as claimed in claim 14, wherein:
the first auxiliary polishing slurry feeding inlet includes a first through-hole penetrating a top surface and a bottom surface of the ring-shaped body portion, the first through-hole being provided as a plurality of first through-holes spaced apart from each other along the ring-shaped body portion, and
the second auxiliary polishing slurry feeding inlet includes a second through-hole penetrating the top surface and the bottom surface of the ring-shaped body portion, the second through-hole being provided as a plurality of second through-holes spaced apart from each other along the ring-shaped body portion.

17. The CMP apparatus as claimed in claim 14, wherein the polishing head includes a head body portion, and the first and second auxiliary polishing slurry feeding lines are in the head body portion.

18. The CMP apparatus as claimed in claim 14, wherein:
the ring-shaped body portion includes the flow groove through which the first and second auxiliary polishing slurries flow at a contact surface at which the ring-shaped body portion contacts the polishing pad, and the flow prevention bumps to prevent the first and second auxiliary polishing slurries from flowing, and
the first and second auxiliary slurry feeding inlets extend vertically through an entire thickness of at least one of the flow groove and the flow prevention bump.

19. A chemical mechanical polishing (CMP) apparatus, comprising:
a polishing pad on a polishing platen;
a first polishing slurry feeding line to feed a first polishing slurry onto the polishing pad;
a polishing head including a membrane to hold a wafer on the polishing pad and a second polishing slurry feeding line to feed a second polishing slurry; and
a retainer ring around the membrane and in contact with the polishing pad to prevent detachment of the wafer, the retainer ring having:
a ring-shaped body portion coupled to a bottom portion of the polishing head,
flow prevention bumps extending from the ring-shaped body portion, the flow prevention bumps being protrusions extending from the ring-shaped body portion and spaced apart from each other in a shape of a circle having an outer diameter smaller than an outer diameter of the sing-shaped body portion,
a flow groove between adjacent ones of the flow prevention bumps, the flow groove extending continuously and radially from an inner diameter to the outer diameter of the circle of the flow prevention bumps, and
a polishing slurry feeding inlet connecting the second polishing slurry feeding line to the flow groove, and the polishing slurry feeding inlet directly facing a top surface of the polishing pad.

* * * * *